United States Patent [19]

Takemura

[11] Patent Number: 5,581,092
[45] Date of Patent: Dec. 3, 1996

[54] GATE INSULATED SEMICONDUCTOR DEVICE

[75] Inventor: Yasuhiko Takemura, Kanagawa, Japan

[73] Assignee: Semiconductor Energy Laboratory Co., Ltd., Kanagawa-ken, Japan

[21] Appl. No.: 300,944

[22] Filed: Sep. 6, 1994

[30] Foreign Application Priority Data

Sep. 7, 1993 [JP] Japan .................................. 5-246408
Nov. 15, 1993 [JP] Japan .................................. 5-308627

[51] Int. Cl.$^6$ .................................................. H01L 29/04
[52] U.S. Cl. ........................... 257/65; 257/66; 257/192; 257/914
[58] Field of Search ........................ 257/65, 66, 72, 257/380, 905, 904, 24, 192, 914; 359/85

[56] References Cited

U.S. PATENT DOCUMENTS

| | | | |
|---|---|---|---|
| 4,772,927 | 9/1988 | Saito et al. | 257/65 |
| 4,849,797 | 7/1989 | Ukai et al. | 257/57 |
| 4,916,508 | 4/1990 | Tsukamoto et al. | 359/85 |
| 5,132,825 | 7/1992 | Miyadera | 359/85 |
| 5,266,816 | 11/1993 | Seto et al. | 257/65 |
| 5,289,030 | 2/1994 | Yamazaki et al. | 257/66 |
| 5,313,087 | 5/1994 | Chan et al. | 257/380 |
| 5,383,041 | 1/1995 | Yamazaki et al. | 359/59 |
| 5,426,064 | 6/1995 | Zhang et al. | 437/40 |
| 5,453,858 | 9/1995 | Yamazaki et al. | 359/85 |
| 5,514,879 | 5/1996 | Yamazaki | 257/65 |

FOREIGN PATENT DOCUMENTS 0483824 5/1992 European Pat. Off. ............... 257/192

OTHER PUBLICATIONS

Hayzelden et al., "In situ transmission electron microscopy studies of silicide–mediated crystallization of amorphous silicon," 1991–1992.

Primary Examiner—Sara W. Crane
Assistant Examiner—Courtney A. Bowers
Attorney, Agent, or Firm—Sixbey, Friedman, Leedom & Ferguson, PC; Gerald J. Ferguson, Jr.; Jeffrey L. Costellia

[57] ABSTRACT

In order to provide TFTs having a low leak current property in its reverse biased state, the active semiconductor layer of the TFTs is doped with an impurity for increasing the band gap thereof, for example, carbon, nitrogen, and oxygen. Also, in order to compensate the decrease in conductivity due to the addition of the impurities, the source and drain regions are provided with or are by themselves formed with metal silicide layers. Further, these low leak current TFTs formed on a substrate are used as pixel transistors in an electro-optical device while peripheral circuits are formed on the same substrate using high mobility TFTs.

30 Claims, 8 Drawing Sheets

GATE INSULATED SEMICONDUCTOR DEVICE

BACKGROUND OF THE INVENTION

The present invention relates to a thin film transistor (hereinafter referred to as a TFT) having a non-single crystalline silicon film and provided on an insulating film formed on an insulating substrate like glass or other various types of substrates, or a thin film integrated circuit as an application thereof, in particular, for an active type liquid crystal display (LCD), and a manufacturing method thereof.

The Si TFTs can be classified into amorphous silicon TFTs and polysilicon (or polycrystalline silicon) TFTs depending on the type and crystallization conditions of the semiconductor material thereof.

Meanwhile, there has also been made research into those semiconductor materials which have crystallization conditions intermediate between amorphous silicon and polysilicon. Although there is an argument as to the intermediate crystallization conditions, any silicon which is crystallized more or less by any method such as thermal annealing at temperatures exceeding 450° C. or irradiation with laser beams, high intensity light beams, and other high energies will be referred to as polysilicon in the present specification.

Further, polysilicon TFTs are also applied as to so called SOI (semiconductor on insulation) technique for monocrystalline silicon integrated circuits and used as load transistors, for example, in highly integrated static random access memories (SRAMs). It should be noted here that amorphous TFT is hardly used for this purpose.

Since a semiconductor circuit having a TFT on an insulating substrate has no capacity coupling between the substrate and wiring thereof, it allows high operational speeds, thus realizing ultra fast microprocessors and memories.

Generally, amorphous semiconductor has a small electric field mobility and cannot therefore be used for TFTs required of high operational speeds. Also, P-type amorphous silicon has too small an electric field mobility to produce P-channel TFTs (PMOS TFTs) and therefore form complementary MOS (CMOS) circuits in combination with N-channel TFTs (NMOS TFTs).

However, TFTs formed of an amorphous semiconductor can have a smaller Ioff current. Accordingly, an amorphous channel TFT can be applied to those devices in which a high operation speed is not so required for TFTs, and TFTs of only one conductivity type are enough and a large charge retention capability is required, for example, an active matrix circuit for an LCD device of a small matrix size.

On the other hand, a polycrystalline semiconductor has a larger electric field mobility and therefore allows higher operational speeds than an amorphous semiconductor. For example, a TFT using a silicon film recrystallized through laser annealing has an electric field mobility as high as 300 $cm^2/Vs$. This value is extremely large considering that a MOS transistor formed on an ordinary monocrystal silicon substrate has an electric field mobility in the order of 500 $cm^2/Vs$. While a MOS circuit formed on a monocrystalline silicon substrate allows only limited operational speeds due to parasitic capacity present between substrate and wiring thereof, a TFT mounted on an insulating substrate is free from those limitations and expected to allow considerably high operational speeds.

Further, polysilicon can be used not only for NMOS TFTs but also for PMOS TFTs and can therefore form CMOS circuits, thus realizing a so called monolithic structure as in active matrix type liquid crystal displays wherein polycrystalline CMOS TFTs constitute not only the active matrix portion but also peripheral circuits thereof (drivers, etc.). A pMOS TFT as a load transistor is constituted by polysilicon also in the SRAM mentioned before.

In amorphous TFTs, it is difficult to form the source and drain regions through a self-aligning process which is used for a monocrystalline IC technology so that parasitic capacity resulting from the geometrical overlapping of the gate electrode with the source and drain electrodes undesirably occurs. On the contrary, polysilicon TFTs are more advantageous in that the self-aligning process can be employed, thus suppressing the parasitic capacity.

However, polysilicon TFTs suffer from larger more leakage current (also called off-state current) in the absence of voltage to the gate electrode thereof (in the off-state thereof) than amorphous TFTs. Consequently, when polysilicon TFTs are used at pixel electrodes of liquid crystal displays, measures have been implemented to provide auxiliary capacity to compensate for the leakage current and further connect two polysilicon TFTs in series to reduce leakage current.

Also, it is known to take advantage of the high off-state resistance of amorphous silicon TFTs and further form the peripheral circuits with polysilicon TFTs having a high electric field mobility on the same substrate. This can be realized by forming amorphous silicon and irradiating it selectively with laser beams to crystallize only the peripheral circuits.

At present, however, the production yield of the above method is low due to low reliability of the laser irradiation process (e.g. poor uniformity of irradiated energy per unit area). Also, since amorphous silicon TFTs with a low electric field mobility are used in the active matrix region, it is difficult to use this method for higher level applications. Instead of the laser irradiation process, a thermal annealing of a higher reliability and lower cost is desired. Also, it is desired that TFTs have an electric field mobility of at least 5 $cm^2/Vs$ to enhance added product values.

In conventional liquid crystal displays, it is known that TFTs constituting decoder/driver circuit and TFTs provided at pixel electrodes arranged in a matrix form are formed on the same substrate. It is not, however, that liquid crystal displays operate only with the decoder and driver circuits and pixel electrodes; they also require CPU and memory circuits, which have conventionally been provided externally and connected with the decoder and driver circuits formed on the glass substrate through such means as wire bonding. This configuration causes the problems of increased manufacturing processes and reduced reliability.

Meanwhile, these amorphous or polycrystalline silicon (collectively referred to as non single crystalline silicon) causes much greater grain boundary effects than monocrystalline silicon used in monocrystalline semiconductor integrated circuits. The typical example is a leakage current between source and drain regions. In particular, leakage current (also-called off current) when applying a reverse bias voltage (negative for N-channel transistors and positive for P-channel transistors) to a gate electrode is caused by the existence of grain boundaries and known to deteriorate the operating characteristics of transistors.

The off-state current is caused by abrupt variations in the electric field at the boundary between the impurity region (N-type or P-type region) of source and drain regions and the channel forming region (substantially intrinsic). While this does not cause a problem in monocrystalline silicon, in the case of a non single crystalline silicon, carriers hop from the conduction band (valence electron band) of the impurity diffused region to the conduction band (valence electron band) of the channel forming region through grain boundaries.

As in monocrystalline MOS devices, an attempt has been made to solve this problem by providing an offset region for relieving the electric field or a low doped drain (LDD) structure for lowering the impurity density of the impurity diffused region.

Referring to FIG. 2 (A), there is shown a conceptual diagram illustrating a conventional offset gate type TFT. Its active layer is roughly divided into three regions. The first region is an impurity region with a high impurity concentration (source and drain regions), designated by 13 and 17 in FIG. 2 (A). The second region is called an offset region or an LDD region, designated by reference numerals 14 and 16. The second region has a high resistance while it is substantially intrinsic or has the same conduction type as the source and drain regions in such a degree that the parasitic channel is suppressed. There is no gate electrode overlapping the second region. The third region is a channel forming region, designated by reference numeral 15. This region is capable of varying the conductivity type and controlling the flow of carriers under the influence of the gate electrode 11 through the gate insulating film 12.

Figure 2A:
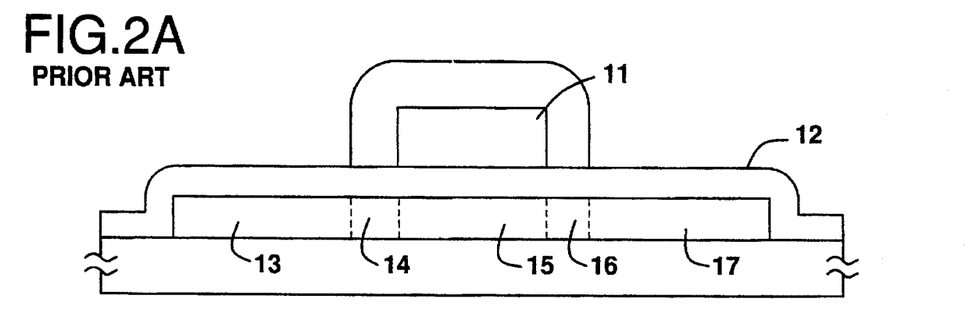
FIG. 2A is a cross sectional view showing a TFT of a prior art.
Figure 2B:
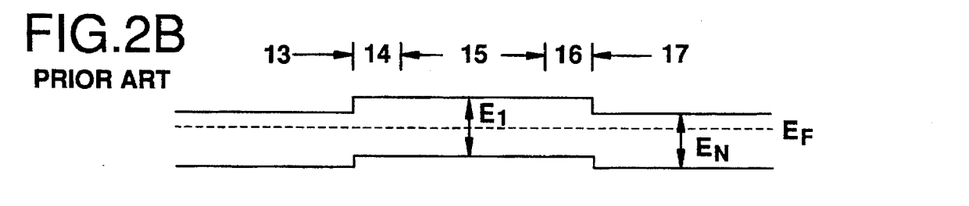
FIG. 2B is a band gap diagram of the TFT shown in FIG. 2A.
Figure 2C:
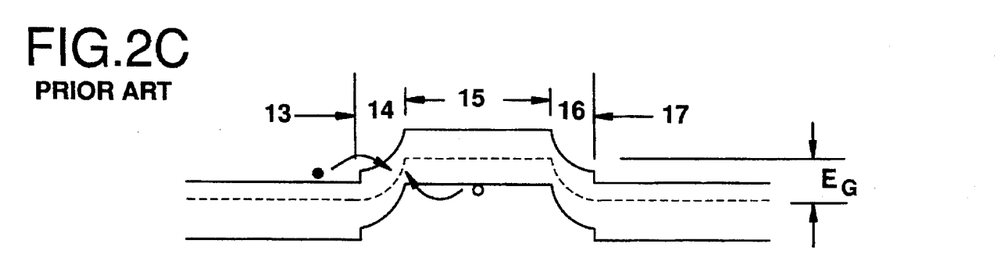
FIG. 2C is a band gap diagram of the TFT shown in FIG. 2A in a reverse bias condition.

FIG. 2B shows an energy band diagram with respect to an active layer in the vicinity of a gate insulating layer in an N channel TFT when there is no voltage applied to a gate electrode and a voltage between source and drain regions is enough small. Here, $E_F$ is a Fermi level, $E_1$ and $E_N$ is a band gap of the channel forming region and the impurity region, respectively. Normally, $E_1=E_N$. Also, a band gap of an offset region is the same as $E_1$. The band gap diagram when applying a reverse bias voltage (i.e. negative voltage) to the gate electrode with the source/drain voltage unchanged is shown in FIG. 2C. As can been seen, the potential of the channel region adjacent to the gate electrode is changed by "$E_G$".

It should be noted that the electric field in a boundary region between the channel forming region and the impurity region is varied moderately because of the existence of the offset regions 14 and 16, resulting in a decrease in a leak current in this region. However, when the source/drain voltage (forward bias voltage) is increased, the band in the drain region 17 shifts to a lower portion than that shown in FIG. 2C with the continuous line. As a result, the electric field across the channel forming region 15 and the drain region 17 becomes steep, causing a leak current through grain boundaries.

Figure 2D:
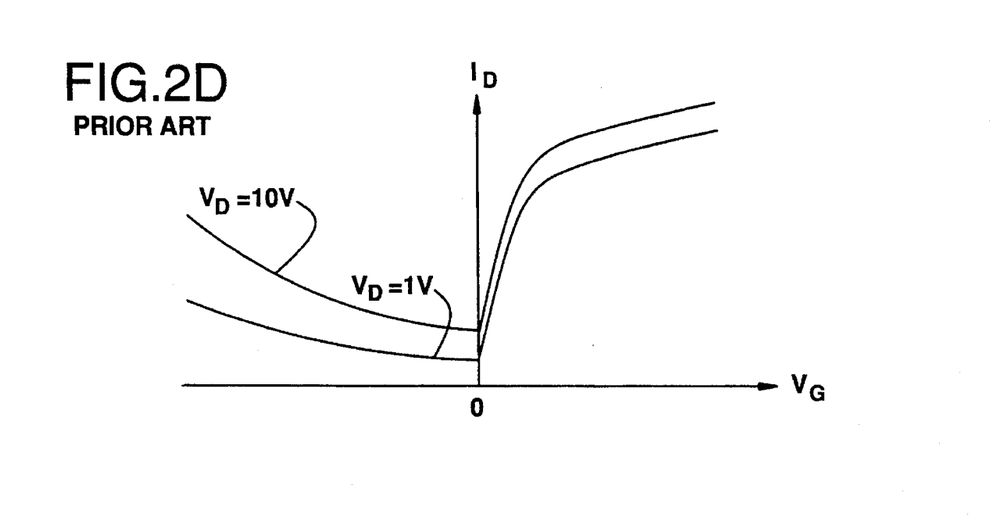
FIG. 2D shows a voltage-current characteristics of a TFT of a prior art.

The above analysis can be proved by experiments where a leak current is not so remarkable when the voltage $V_D$ between the source and drain region is small, it increases as the $V_D$ increases, and it becomes more larger when the reverse bias voltage (i.e. a negative voltage in the case of a NTFT) increases. See FIG. 2D.

Accordingly, the electric field in a region between the channel and drain regions has to change moderately even when the source/drain voltage $V_D$ is large in order to reduce the leak current.

In particular, the foregoing problem is more significant when the active layer contains a metallic element for promoting a crystallization thereof even though the concentration of the element is very small. Examples of the metallic element are Ni, Fe, Co, Ru, Rh, Pd, Os, Ir, Pt, Sc, Ti, V, Cr, Mn, Cu, Zn, Au, and Ag. These elements are added in a silicon semiconductor in order that a crystallization temperature of the non-crystalline silicon is lowered and the time for crystallization can be reduced. However, these elements tend to form intermediate levels within the band gap and have a same function as grain boundaries, resulting in an increase of a leak current.

BRIEF SUMMARY OF THE INVENTION

An object of the present invention is to solve the foregoing problems and provide an excellent TFT or semiconductor integrated circuits employing those TFTs. Specifically, an object of the invention is to minimize a leak current of a TFT when applying a reverse bias voltage thereto.

In accordance with a first aspect of the invention, an active layer of a TFT is provided with a region having a larger band gap (Eg) by adding thereto an appropriate impurity such as oxygen, nitrogen or carbon. Also, a similar effect can be obtained by irradiating a portion of an active layer in an amorphous state or polycrystalline state with high speed ions which are accelerated with an acceleration voltage of 30 eV, for example. The portion of the semiconductor layer is damaged by the bombardment with the ions, and the crystallinity of this portion is not completely cured even with a subsequent crystallization step such as a heat annealing step. As a result, the leak current can be lowered because of the existence of this lower crystallinity region. The ions to be utilized are preferably those of oxygen, carbon, nitrogen or silicon. It is also preferable that hydrogen ions are mixed with these ions.

It is another object of the invention to provide an integrated circuit for an electro-optical device such as a liquid crystal device by forming on a same substrate a first group of TFTs for driving pixels (pixel TFTs), a second group of TFTs for constituting decoder or driver circuits and a third group of TFTs for constituting a memory or CPU.

BRIEF DESCRIPTION OF THE DRAWINGS

The foregoing objects and features of the invention will be explained in more detail in preferred embodiments of the invention with reference to the attached drawings in which.

DESCRIPTION OF THE PREFERRED EMBODIMENTS OF THE INVENTION

A first preferred embodiment of the invention relates to a method in which a leak current is reduced by increasing a band gap of an active layer of a TFT. In an offset gate type TFT such as shown in FIG. 2A, if the band gap increases, even though the steepness of the electric field between the channel region and the drain region is unchanged, the hopping conduction of the carriers from the valence band (or conduction band) of the channel region to a conduction band (or a valence band) of the drain region can be suppressed because the gap between the conduction band and the valence band is increased and the effect of the offset-gate area increases. The band gap of a silicon semiconductor can be increased by adding impurities such as carbon, nitrogen or oxygen. As the increase in the concentration of the impurity, it is possible to increase the band gap, however, the characteristics of the semiconductor tends to degrade.

Accordingly, the concentration of these impurities in total should be within a range of $1 \times 10^{19}$ atoms/cm$^3$ to $2 \times 10^{21}$ atoms/cm$^3$, preferably, $5 \times 10^{19}$ to $7 \times 10^{20}$ atoms/cm$^3$. In the meantime, the concentration of these impurities is a minimum value in a secondary ion mass spectroscopy (SIMS).

Figure 1A:
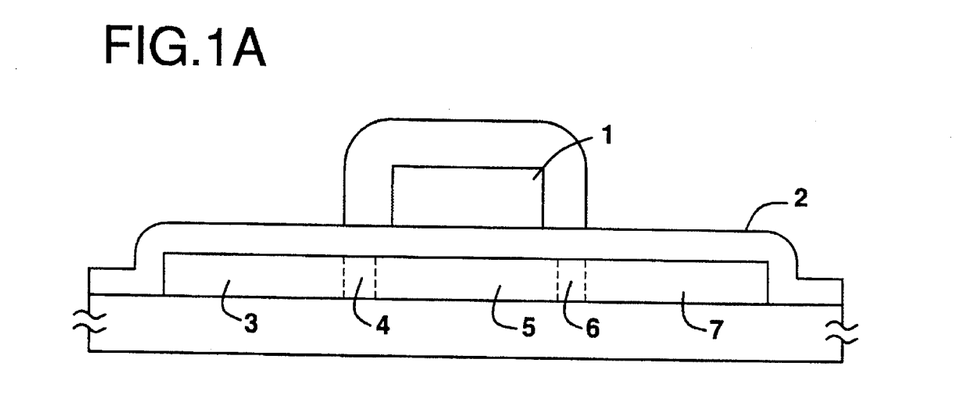
FIG. 1A is a cross sectional view showing a TFT in accordance with the present invention.
Figure 1B:
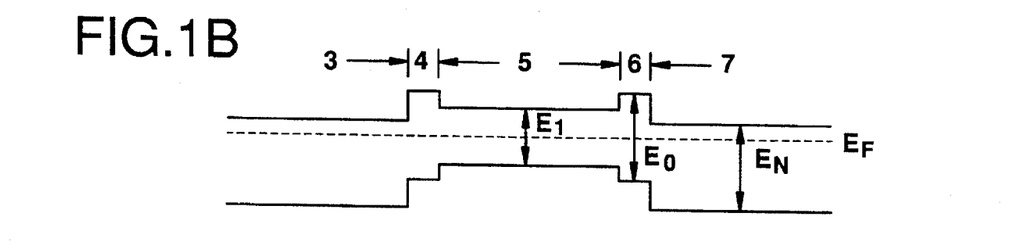
FIG. 1B is a band gap diagram of the TFT shown in FIG. 1A.

In the above method, however, there is a drawback that the ON current when applying a forward bias voltage to the gate electrode is undesirably reduced because the channel region is also added with the above impurities. In order to solve such a drawback, this inventor proposes to provide regions 4 and 6 in a semiconductor layer as shown in FIG. 1A. That is, the regions 4 and 6 are located between the impurity regions 3, 7 and the channel 5 and have a larger band gap and resistivity than the channel region 5. The regions 4 and 6 may be substantially intrinsic or have the same conductivity type which is the same as the impurity regions 3 and 7 in such a degree that a parasitic channel can be suppressed. FIG. 1B shows an energy band diagram of a portion of an NTFT close to a gate electrode. As can been seen, $E_1$ is smaller than $E_0$, and generally, $E_1$ is smaller than $E_N$. Accordingly, the TFT has such a configuration in which $E_1 < E_0 \leq E_N$, alternatively, $N_1 < N_0 \leq N_N$ where N is a concentration of the added impurities carbon, oxygen and/or nitrogen.

Figure 1C:
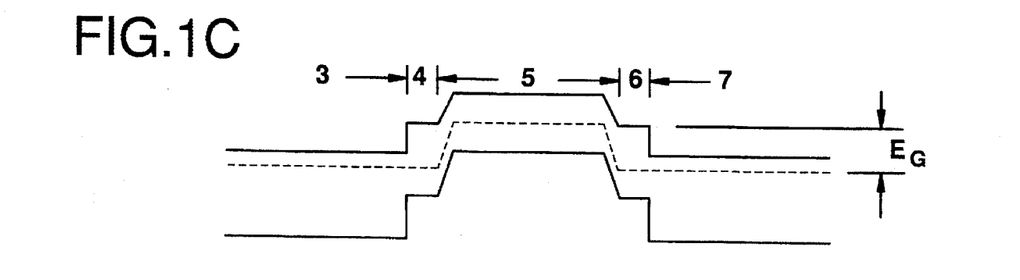
FIG. 1C is a band gap diagram of the TFT shown in FIG. 1A in a reverse bias condition.
Figure 1D:
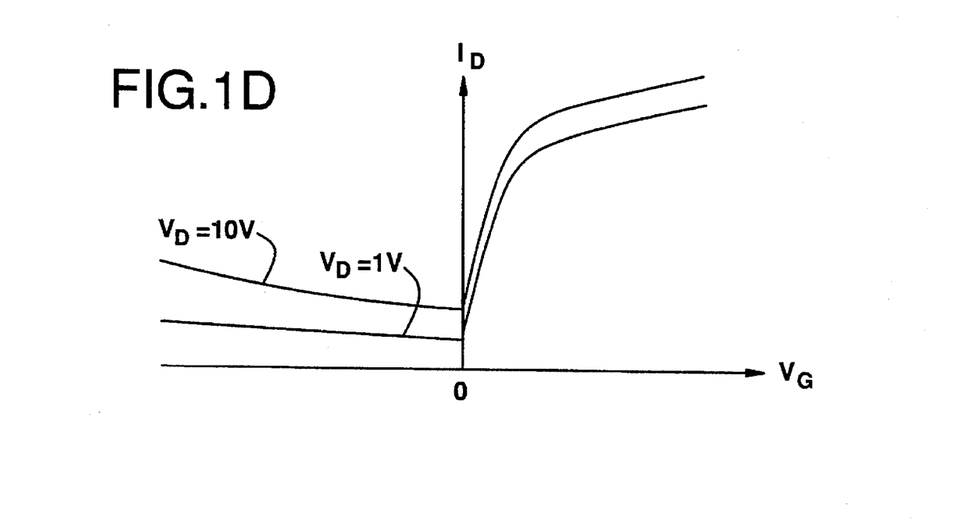
FIG. 1D shows a voltage-current characteristics of a TFT in accordance with the present invention.

Also, FIG. 1C shows an energy band diagram in the case that a negative (reverse) bias voltage is applied to a gate electrode. As is clear from the diagram, the regions 4 and 6 significantly prevent carriers from flowing between the conduction (valence) band of the impurity region and the valence (conduction) band of the channel region. As a result, as shown in FIG. 1D, the off current reduces, especially, and even when the source/drain voltage $V_D$ is relatively large, the off current can be stabilized as compared with a conventional offset gate TFT.

At the same time when the regions 4 and 6 are doped with C, N and O impurities, the impurity regions 3 and 7 may also be doped with the same impurities at the same concentration. At this time, the energy band gap $E_0$ of the regions 4 and 6 equals the energy band gap $E_N$ of the impurity regions 3 and 7.

The foregoing impurities may be added by ion doping or ion injection method. A thermal annealing, laser annealing or a lump annealing should be performed after the doping in order to cure the semiconductor film which is damaged during the addition of the impurity. Thus, the added impurities can uniformly combine with silicon atoms and grain boundaries can be neutralized. In particular, in the case of the configuration shown in FIG. 1A, it is desirable that the P-type or N-type impurity in the impurity regions is simultaneously activated. In the alternative, when the entire region of the semiconductor layer is doped with the impurity as explained above, the impurity may be added simultaneously during the deposition of the semiconductor layer. In such a case, the concentration of the impurity is of course uniform throughout the semiconductor layer. The followings are examples of the manufacture of TFTs in accordance with the foregoing method.

[EXAMPLE 1]

FIGS. 3A–3E are cross sectional views showing a manufacturing method of a TFT. Initially, referring to FIG. 3A, silicon oxide is deposited onto a substrate 101 (Corning 7059) by sputtering to a thickness 2000 Å to form an underlying layer 102. The substrate is preferably heated at a temperature higher than a distortion point of the substrate and then gradually cooled at a cooling rate of 0.1° to 1.0° C./minute to a temperature less than the distortion point. Thereby, it is possible to reduce the contraction of the substrate due to heating in subsequent steps, resulting in an improvement of the accuracy of the mask alignment. In the case of a Corning 7059, the substrate is heated at 620°–660° C. for 1–4 hours, then cooled at a rate 0.01° to 1.0° C./minute, preferably, 0.03°–0.3° C./minute to 400°–500° C., at which temperature the substrate is taken out from a furnace. (This step is called "preheating" hereinafter.) The preheating may be performed either before or after the formation of the underlying film.

Figure 3A:
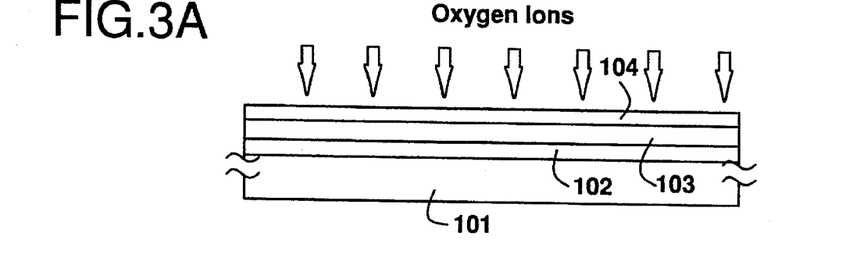
FIGS. 3A–3E are cross sectional views showing a manufacturing method of a TFT in accordance with the first example of the invention.

Then, an intrinsic amorphous silicon film 103 is formed by a plasma CVD to a thickness 200–2000 Å, preferably, 300–1500 Å, for example 1200 Å on the underlying film 102. Further, a silicon oxide film 104 is formed thereon by plasma CVD to a thickness of 100–800 Å, for example, 200 Å. The silicon oxide film 104 functions as a blocking layer in order to prevent the surface of the silicon film from being damaged during subsequent heating step.

Further, oxygen ions are introduced into the semiconductor film 103 at a dose $1 \times 10^{14}$–$3 \times 10^{16}$ atoms/cm$^2$, for example at $2 \times 10^{15}$ atoms/cm$^2$ through an ion injection method. The injection is carried out in such a manner that injection energy is selected so that a peak of the concentration locates at the boundary between the amorphous silicon film 103 and the underlying film 102. As a result, the amorphous silicon film 103 is added with oxygen at $5 \times 10^{19}$ to $2 \times 10^{21}$ atoms/cm$^3$ (the concentration depends upon the deepness). This can be measured through SIMS analysis. The addition of the oxygen may be carried out at the same as the deposition of the silicon film. Subsequently, the silicon film is crystallized through a heat annealing at 600° C. for 48 hours in a nitrogen gas (atmospheric pressure).

Figure 3B:
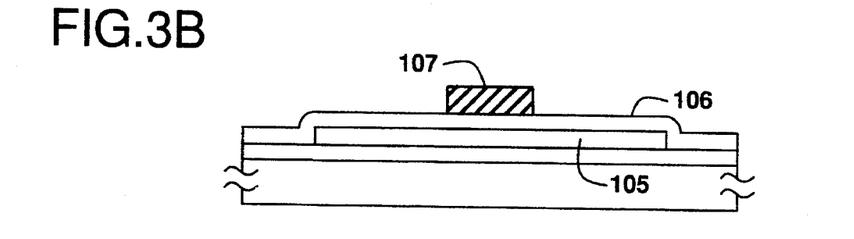

After the crystallization, the silicon oxide film 104 is removed. The crystallized silicon film is patterned into an island form comprising an intrinsic or substantially intrinsic polycrystalline silicon to become an active layer 105 of a TFT as shown in FIG. 3B. Here, the term "substantially intrinsic" implies that the semiconductor may be slightly inclined to N– or P–. The active layer 105 has a dimension from 50 μm×20 μm to 100 μm×1000 μm, which is determined considering the channel length and the channel width of the TFT. It should be noted that while only one silicon island is shown in the figure, a number of silicon islands are to be formed simultaneously on the substrate.

Then, a silicon oxide film 106 is formed through a plasma CVD over the silicon island 105 as a gate insulating film. TEOS [tetra-ethoxy-silane, $Si(OC_2H_5)$] and oxygen are used as a starting gas for the CVD. The substrate temperature is in the range of 300° to 550° C., for example, 400° C. A thermal oxidation may be employed instead of the plasma CVD.

Then, a gate electrode 107 is formed on the gate insulating layer 106 by depositing aluminum through sputtering to a thickness of 3000–8000 Å, for example, 6000 Å and patterning it. The aluminum may contain scandium or other IIIa group element (i.e. rare earth element) therein at 0.01–0.25%. It is also possible to use another metal such as tantalum, titanium, or a semiconductor material doped with phosphorous in place of aluminum.

Figure 3C:
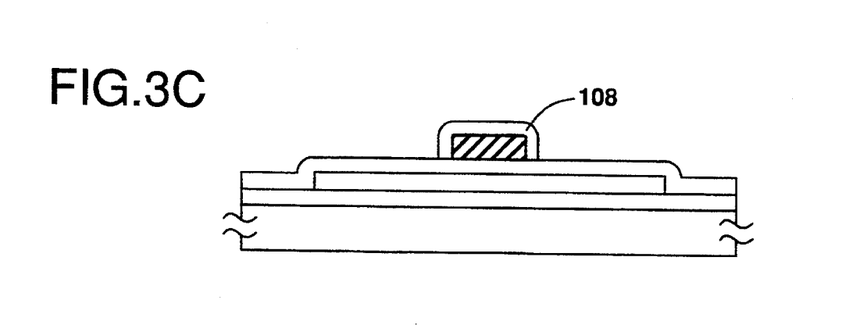

Referring to FIG. 3C, an oxide layer 108 is formed by anodically oxidizing the surface of the aluminum electrode. The anodic oxidation may be carried out using an ethylene glycol solvent in which a tartar acid is added at 1–5%. The thickness of the oxide layer is 2000 Å, for example. Since source and drain regions are to be defined in approximately alignment with the outer edge of the oxide layer, it is possible to determine the thickness of an offset gate area by the anodic oxidation step.

Figure 3D:
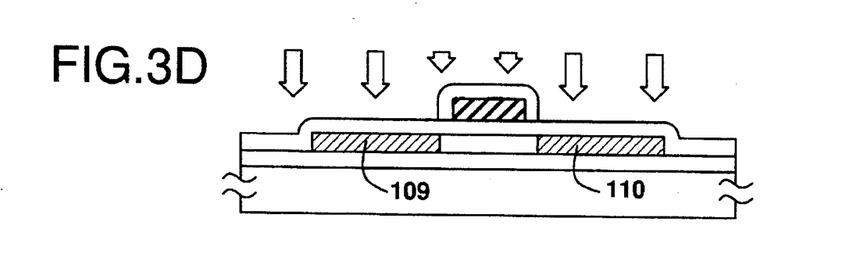

Then, N-type impurity is introduced into the silicon island 105 by using the gate electrode portion (including the gate electrode 107 and the surrounding oxide layer 108) as a mask in a self-aligning manner through an ion doping method (also called as plasma doping method). Phosphine gas ($PH_3$) is used as a doping gas. The accelerating voltage is 60–90 kv, for example, 80 kV. The dose is in the range of $1\times10^{15}$ atoms/$cm^2$ to $8\times10^{15}$ atoms/$cm^2$, for example, $5\times10^{15}$ atoms/$cm^2$. As a result, N-type impurity regions 109 and 110 are formed as source and drain regions. (FIG. 3D).

Then, as shown in the drawing, a laser irradiation is carried out from an upper portion of the gate electrode in order to activate the added impurity. A KrF excimer laser (wavelength: 248 nm, pulse duration: 20 nsec.) or other lasers may be used as a light source. The energy density is 200–400 mJ/$cm^2$, for example, 250 mJ/$cm^2$; and 2 to 10 shots, e.g. 2 shots are used per one site. Also, the substrate may be heated at 200°–450° C. during the laser irradiation in order to enhance the effect of the irradiation.

Alternatively, a lump anneal (also called rapid thermal anneal, RTA) with a visible or near IR light may be used instead of the laser. The visible or near IR light is easy to be absorbed by a crystalline silicon or an amorphous silicon added with phosphorous or boron at $10^{19}$ to $10^{21}$ atoms/$cm^3$ and can achieve an effect comparable with that obtained through a heat annealing at 1000° C. or higher. This can be understandable because these silicon films are observed as a black color by the eye. On the other hand, since the visible or near IR light is not absorbed by a glass substrate so much, the substrate is not so heated and the heating time may be shorter. Accordingly, this method is desirable when a contraction of the glass substrate by heat is problematic.

Figure 3E:
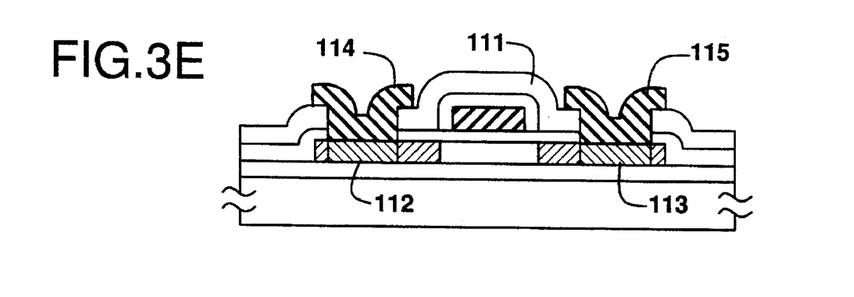

Referring to FIG. 3E, after the activation of the impurity, a silicon oxide film 111 of a thickness 6000 Å is formed as an interlayer insulator through a plasma CVD. A multilayer film of polyimide and silicon oxide, or a single layer of polyimide may be used as the interlayer insulator in place of the plasma CVD silicon oxide. Further, contact holes having a larger diameter than conventional ones are formed through the interlayer insulator 111. Titanium or nickel is formed on the entire surface of the structure to a thickness of 100–500 Å. The formed metal film is reacted with the source and drain regions 109 and 110 by irradiation with laser or an intense light of a visible or near infrared ray in order to form metal silicide regions 112 and 113. Thereafter, the remaining metal without reacting with silicon is removed by etching. Furthermore, electrode/wiring 114 and 115 are formed with a metallic material such as a multilayer film comprising titanium nitride and aluminum. Finally, the entire structure is annealed at 350° C. for 30 minutes at 1 atm, thus the TFT is completed.

In the foregoing structure, it is possible to lower the off current from $1\times10^{-10}$ A of a conventional case to as low as $3\times10^{-12}$ A when the gate electrode voltage is 0 V. Moreover, when a drain voltage is 10 V and a gate voltage is –10 V, the leak current is $3-5\times10^{-12}$ A which is 1/30 of the leak current in the conventional case.

[EXAMPLE 2]

A manufacturing method of a TFT in accordance with a second example of the invention will be described in connection with FIGS. 4A to 4E. A Corning 7059 glass is used as a substrate 201. The thickness and the size of the substrate is, for example, 1.1 mm and 300×400 mm. A preheating step is performed in the same manner as in the first example. Further, silicon oxide is deposited onto the substrate 201 to a thickness of 2000 Å as a base film 202 through a plasma CVD. As a starting gas for the deposition, TEOS and oxygen are used. Then, an amorphous silicon film 203 of 1000 Å thick and a silicon oxide film 204 of 2000 Å thick are deposited through LPCVD or plasma CVD. Thereafter, a hole is opened through the silicon oxide film 204 in the region 205. Further, a film 206 comprising nickel is formed over the entire surface to a thickness of 5–20 Å. The film is not necessarily be in the form of a film but may be in the other forms e.g. clusters. Also, other metal elements such as Pb or In may be used for promoting the crystallization of the amorphous silicon film.

Figure 4A:
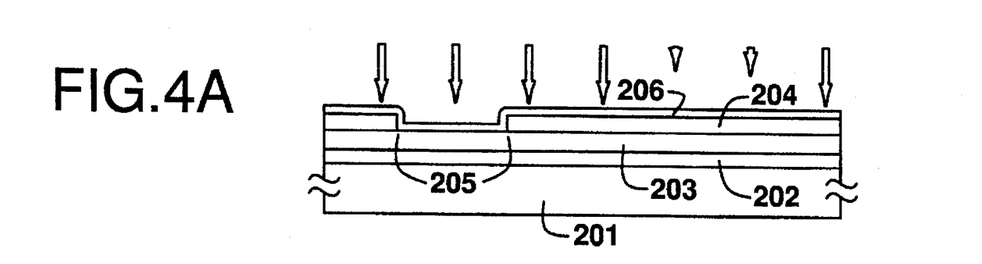
FIGS. 4A–4E are cross sectional views showing a manufacturing method of a TFT in accordance with the second example of the invention.

Then, an ion injection method for injecting nitrogen ions into the films is performed at a dose of $1\times10^{14}$ to $3\times10^{16}$ atoms/$cm^2$, for example, $2\times10^{15}$ atoms/$cm^2$. The accelerating energy for the implantation is selected so that the concentration of the ions takes its maximum at the boundary between the amorphous silicon film 203 and the silicon oxide film 204. As a result, nitrogen ions are contained in the amorphous silicon film 203 at $1\times10^{20}$ to $1\times10^{21}$ atoms/$cm^3$ (it varies depending on the depth). This is confirmed through SIMS analysis. (FIG. 2A).

Figure 4B:
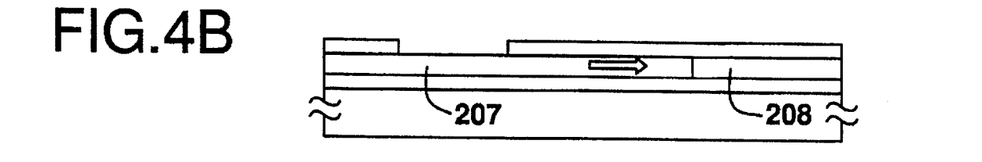

Then, the silicon film is crystallized by heat annealing at 550° C. for 8 hours or at 600° C. for 4 hours. The crystallization proceeds in a lateral direction from the region 205 to its surroundings as the nickel diffuses in the silicon film. The crystal growth extends to typically 20–100 μm. In FIG. 4B, the region 207 of the silicon film is a crystallized region while the region 208 remains non-crystalline.

Figure 4C:
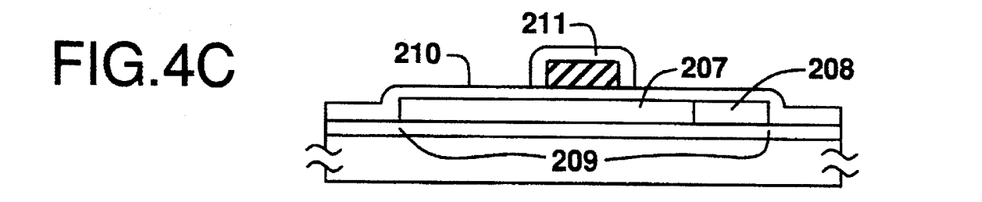

After the heat annealing step, the silicon oxide film 204 is removed and then the silicon film is patterned into an active layer 209 in the form of an island. A gate insulating film 210 is formed through a plasma CVD using a TEOS and oxygen as a starting material. The thickness of the gate insulating film 210 is 70 to 120 nm, typically, 120 nm. The substrate temperature is 350° C. Further, a gate electrode is formed by depositing and patterning an aluminum film on the gate insulating film. The aluminum film is formed by sputtering to a thickness 6000 to 8000 Å, for example, 6000 Å and may contain scandium at 0.01 to 0.2% or other IIIa group elements (i.e. rare earth elements). An anodic oxide film is formed on the surface of the gate electrode in the same manner as in the first example. Thus, a gate portion 211 including a gate electrode and the anodic oxide film is formed as shown in FIG. 2C.

Figure 4D:
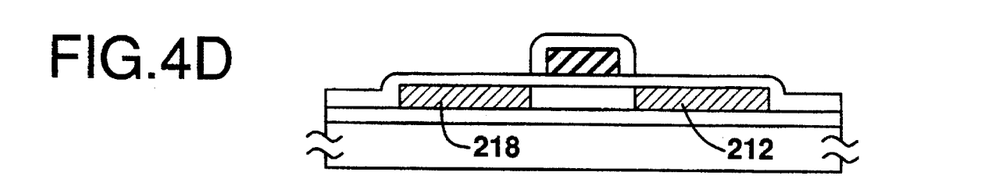

Source and drain regions 218 and 212 are formed by introducing phosphorous as an N-type impurity in a self-aligning manner with respect to the gate portion 211. Then, KrF excimer laser is irradiated in order to improve the crystallinity of the film which has been deteriorated due to the ion implantation. The laser energy density is 250–300 mJ/cm$^2$. Also, the sheet resistance of the source and drain regions becomes 1–8 kΩ/square. Also, instead of using a laser, a lump anneal with visible or near infrared light may be used. The active layer is entirely crystallized by this annealing step. (FIG. 4D).

Figure 4E:
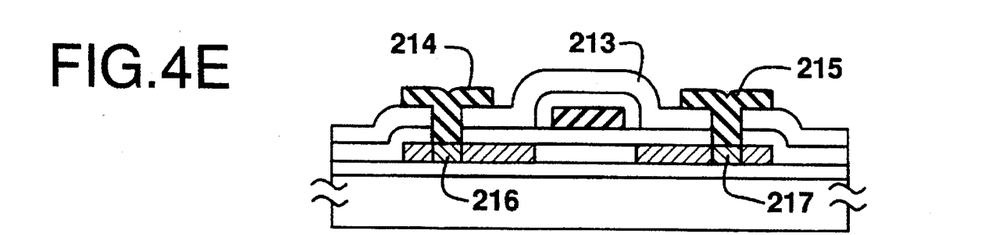

Then, referring to FIG. 4E, an interlayer insulator 213 is formed with silicon oxide or polyimide. Contact holes are formed through the insulator so that electrodes 214 and 215 are formed on the source and drain regions of the TFT with a multilayer film of chromium and aluminum. Finally, a hydrogenation is performed in a hydrogen atmosphere at 200°–400° C. for 1 hour so that the silicon in the source and drain regions 211 and 212 and the electrode material react with each other to form metal silicide regions 216 and 217 in the contact portions. Thus, the manufacture of a TFT is completed. A passivation film comprising silicon oxide or aluminum nitride may be further formed on the entire surface.

The TFT of the second example can be crystallized in a shorter time and at a lower temperature than that of the first example because of the use of the nickel additive. It is confirmed that the active layer contains nickel at $3\times10^{17}$ to $5\times10^{19}$ atoms/cm$^3$ through SIMS. Despite the existence of the nickel, the leak current can be suppressed because the active layer also contain nitrogen at $1\times10^{19}$ to $2\times10^{21}$ atoms/cm$^3$, preferably, $1\times10^{20}$ to $5\times10^{20}$ atoms/cm$^3$.

Also, in this example, the nitrogen contained in the silicon film firmly terminates the dangling bonds of the silicon. This effect is also seen when using carbon or oxygen instead of nitrogen. However, the effect is not so remarkable when using oxygen. Silicon dangling bonds exist especially around the grain boundaries and cause the leak current there, however, they are effectively terminated in accordance with the present invention as said above. Also, metal elements such as nickel added in the silicon film are also fixed by the added nitrogen or carbon, resulting in improving the semiconductor property.

[EXAMPLE 3]

The third example of the invention will be explained referring to FIGS. 5A to 5E. A 7059 glass is used as a substrate 301 and the preheating is performed in the same manner as in the first example. On the substrate 301 having an underlying film 302 thereon, an amorphous silicon film of 300–800 Å, for example 800 Å is formed through a plasma CVD. Then, a silicon oxide film of 2000 Å (not shown) is formed thereon. Further, a nickel film of 5–20 Å (not shown) is formed by sputtering after opening a hole through the silicon oxide film in the same manner as in the second example.

Figure 5A:
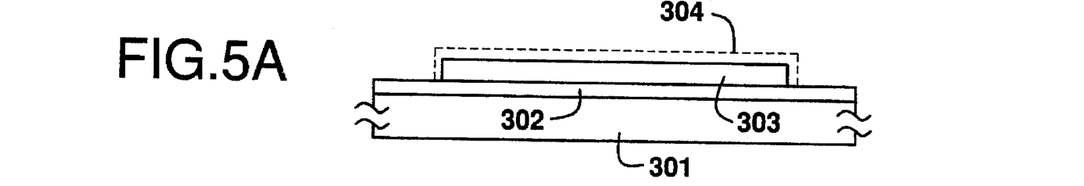
FIGS. 5A–5E are cross sectional views showing a manufacturing method of a TFT in accordance with the third example of the invention.

Subsequently, the silicon film is crystallized by annealing in a nitrogen gas at 600° C. for 4 hours. After the crystallization, the overlying silicon oxide film is removed to expose the surface of the silicon film. Then, the silicon film is exposed to an oxidizing atmosphere such as oxygen, ozone or monoxide dinitrogen at 550° C. for 1 hour in order to form a thin silicon oxide film (not shown) on the surface. Thereafter, the silicon film is patterned into the active layer 303, following which the thin silicon oxide film is removed.

Again, another silicon oxide film 304 is formed on the surface of the active layer 303 through a thermal annealing in an oxidizing atmosphere at 600° C. for one hour as shown in FIG. 5A. After the thermal annealing, the substrate is rapidly cooled down to 450° C. at a cooling rate not smaller than 2° C./second, preferably, not smaller than 10° C./second. This prevents the substrate from contracting due to the thermal annealing. When a furnace used does not allow such a rapid cooling, a similar effect may be obtained by taking out the substrate and expose it in a room temperature.

Figure 5B:
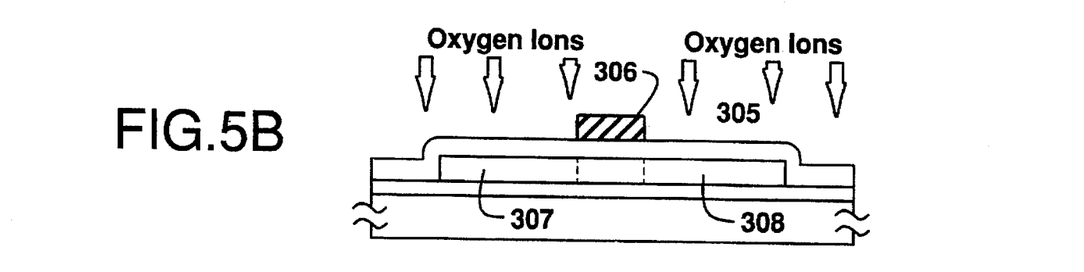

Then, referring to FIG. 5B, in the same manner as in the first example, the gate insulating film 305 of silicon oxide and a gate electrode of aluminum 306 are formed on the silicon film 303. Then, oxygen ions are introduced into the active layer 303 by an ion doping method using the gate electrode 306 as a mask in a self-aligning manner to form regions 307 and 308 in which oxygen is contained at a higher concentration (oxygen doped regions, hereinafter). The ion doping is performed with the dose of $5\times10^{15}$ atoms/cm$^{-2}$ and in such a manner that the concentration of the oxygen ions takes its maximum value at the boundary between the active layer 303 and the gate insulating film 305. As a result, the oxygen doped regions 307 and 308 contain oxygen at a concentration ranging from $5\times10^{19}$ to $5\times10^{20}$ atoms/cm$^3$ (varying in a depth direction). This is confirmed through SIMS measurement.

Accordingly, the energy band gap of the doped regions 307 and 308 are larger than the region which is defined between the regions 307 and 308.

Figure 5C:
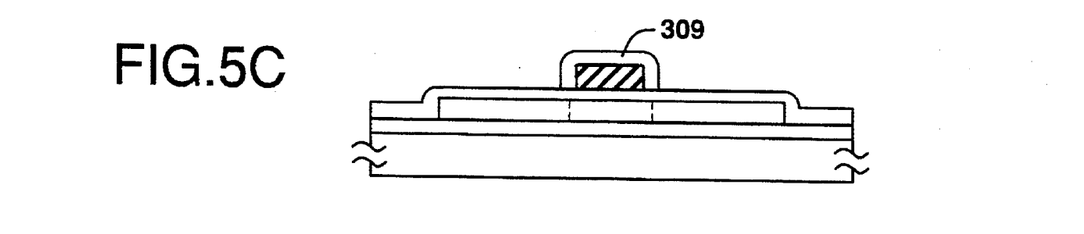

Referring to FIG. 5C, an anodic oxide layer 309 is formed in the same manner in the first example.

Figure 5D:
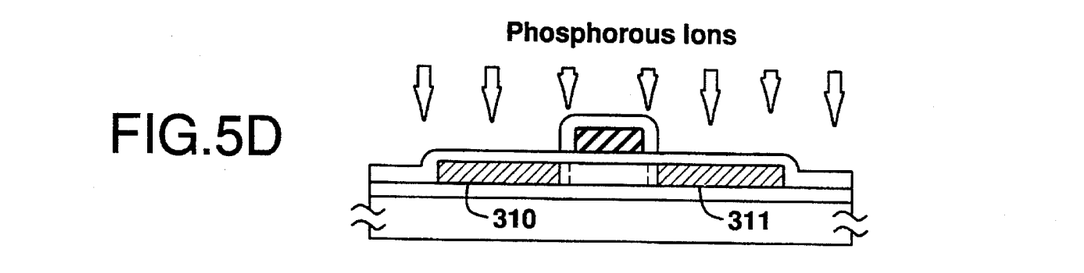

Referring to FIG. 5D, phosphorous is doped into the active layer with the gate portion used as a mask in a self-aligning manner in the same manner as in the first example, thereby forming impurity regions 310 and 311. The dose is $1\times10^{13}$ to $1\times10^{16}$ atoms/cm$^{-2}$, for example, $5\times10^{15}$ atoms/cm$^{-2}$ for making the doped regions N+ type. Then, these regions are irradiated with laser to activate the impurities. Accordingly, the energy band configuration shown in FIG. 1B can be obtained.

Figure 5E:
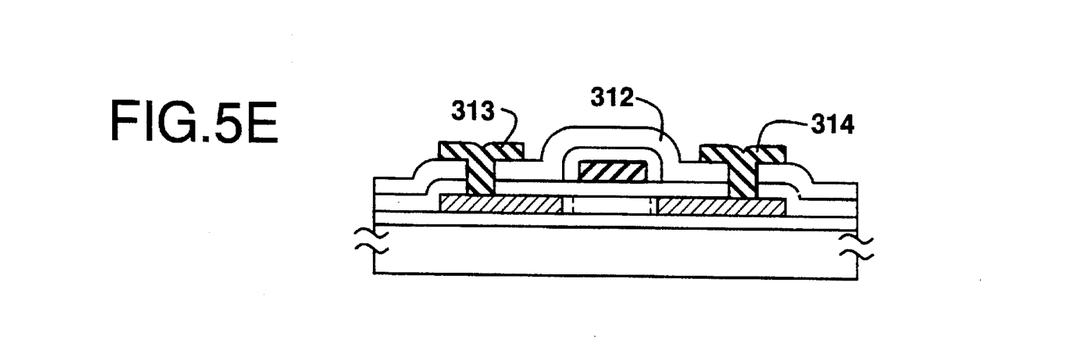

Further, referring to FIG. 5E, an interlayer insulator 312 is formed having contact holes therein. Through the contact holes, metal wirings 313 and 314 are formed contacting the source and drain regions. Thus, a pair of first regions is formed, in which oxygen is contained at a higher concentration and between which a channel region is defined. Also, a pair of second regions containing oxygen at a higher concentration and locating on the outside of the first regions are formed as source and drain regions. Further, there may be an N− type region between the first and second regions.

Accordingly, a TFT having a similar structure as that shown in FIG. 1A can be obtained. In this example, it is possible to obtain a higher ON/OFF ratio than in the first and second examples inasmuch as the channel region is not doped with oxygen. In particular, even when applying a large drain voltage as large as 10 V, a good characteristics can be obtained without a leak current in the range of 0 to −10 V of the gate voltage.

In the alternative, it is possible to form an LDD structure in the following manner. An anodic oxide film 309 is formed to 500–1000 Å thick. With this oxide film as a part of a mask, an N-type impurity is initially added at a dose of $1\times10^{13}$ to $1\times10^{16}$ atoms/cm$^2$, following which an anodic oxide film is further formed to a thickness of 2000–5000 Å. Then, the N-type impurity is again added at a dose of $1\times10^{15}$ to $1\times10^{16}$ atoms/cm$^2$. Thus, LDD regions or substantially intrinsic regions can be formed between the channel forming region and the source/drain regions. In particular, since oxygen functions as an N-type impurity, it is possible to further add phosphorous at $1\times10^{13}$ to $1\times10^{14}$ atoms/cm$^2$.

[EXAMPLE 4]

Figure 6A:
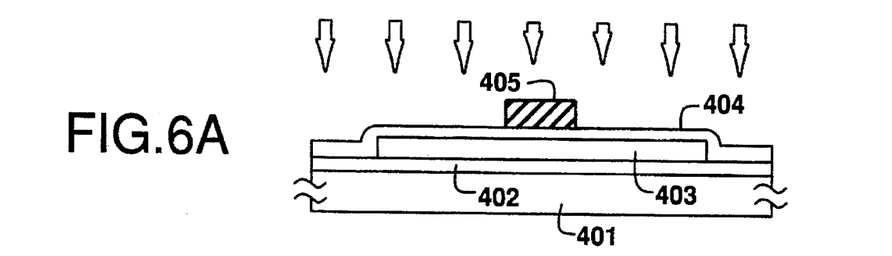
FIGS. 6A–6E are cross sectional views showing a manufacturing method of a TFT in accordance with the fourth example of the invention.

The fourth examples of the invention will be described in conjunction with FIGS. 6A to 6E. A base silicon oxide film 402, an active layer 403, a silicon oxide gate insulating film 404, an aluminum gate electrode 405 are formed on a Corning 7059 substrate 401 in the same manner as in the third example. Then, a portion of the active layer 403 is doped with carbon, nitrogen, or oxygen, in this case, oxygen by ion doping with the gate electrode 405 as a mask in a self-aligning manner. The dose of the oxygen ions is selected in the range of $1\times10^{14}$ to $3\times10^{16}$ atoms/cm$^2$, for example, $5\times10^{15}$ atoms/cm$^2$ in order that the concentration of the oxygen in the active layer is in the range of $1\times10^{19}$ to $2\times10^{21}$ atoms/cm$^3$, preferably, $5\times10^{19}$–$5\times10^{20}$ atoms/cm$^3$. The accelerating energy is selected so that the peak of the concentration takes its maximum value at the boundary between the active layer 403 and the gate insulating film 404. (FIG. 6A).

Figure 6B:
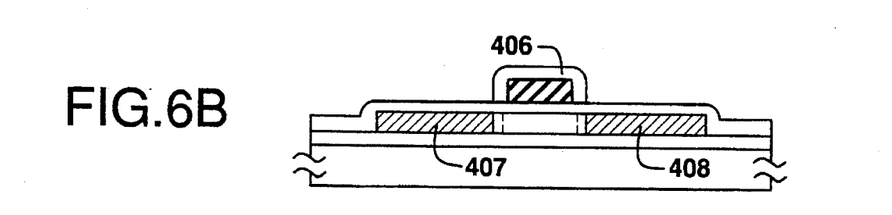

Thereafter, the gate electrode 405 is anodic oxidized in the same way as the first example to form an anodic oxide layer 406. Using the gate electrode and the anodic oxide layer as mask, the active layer is doped with impurity (phosphorous) to form impurity regions 407 and 408 in a self-aligning manner. The dose is smaller than that in the case of the third example, $1\times10^{13}$ to $5\times10^{14}$ atoms/cm$^2$, for example, $2\times10^{14}$ atoms/cm$^2$. Then, the added impurity is activated through a laser irradiation. As a result, source and drain regions containing the impurity at $1\times10^{18}$ to $5\times10^{19}$ atoms/cm$^3$ are formed. (FIG. 6B).

Figure 6C:
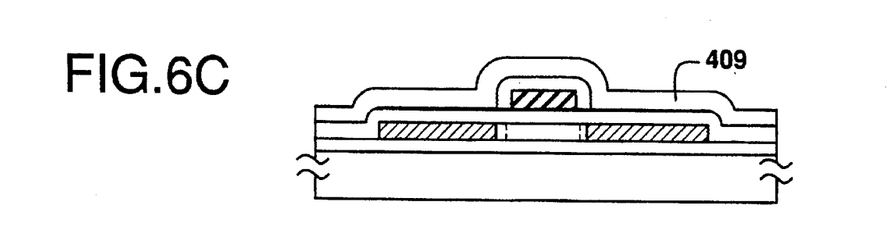

Subsequently, a silicon oxide film 409 of 3000–3000 Å thickness, for example, 9000 Å is formed through a plasma CVD. (FIG. 6C).

An etching step is performed onto the silicon oxide film 409 through a known RIE method, i.e. anisotropic dry etching. At this time, the thickness of the silicon oxide film 409 adjacent to the side surface of the gate electrode is two times as much as the silicon oxide film itself (9000 Å). The etching is continued until the source and drain regions 407 and 408 are exposed. As a result, the insulating material remains only adjacent to the side surfaces of the gate electrode as indicated by the reference numerals 410 and 411.

Figure 6D:
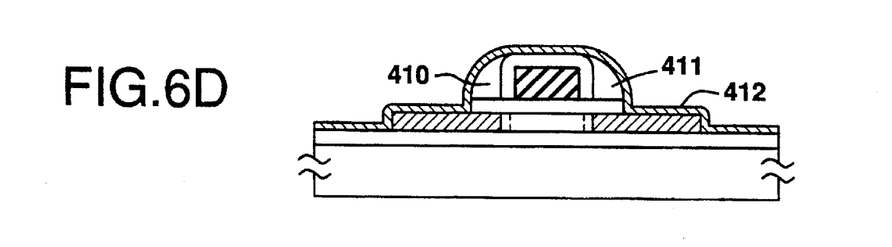

Then, a film 412 comprising a material which is capable of forming a silicide, for example, titanium is formed by sputtering to a thickness of 50 –500 Å. Other examples of the material are tungsten, platinum, palladium and nickel. (FIG. 6D).

Then, a laser light is irradiated onto the above structure in its as preheated condition at 250°–450° C. so that the temperature is raised suddenly to 500°–800° C. As a result, the titanium film and the silicon reacts with each other to form titanium silicide regions 413 and 414 on the source and drain regions. The titanium silicide has a resistivity as low as 30–100 μΩ cm. The sheet resistance of the source and drain regions is substantially not higher than 10 Ω/square. As shown in FIG. 6D, when the formation of the silicide is performed to an extent that the silicide layer reaches the substrate surface, it is not necessary to provide a barrier layer at a contact portion of aluminum electrodes 416 and 417. Thus, the process can be simplified.

Instead of using the laser light, the above step may be carried out with an IR lump, so called rapid thermal annealing (RTA) or lump annealing. In this case, the annealing is conducted for a few minutes at 600° C. or for a few seconds at 1000° C. The temperature is measured by monitoring the temperature of a silicon wafer. The energy band gap of the semiconductor layer has the equation, $E_1<E_0<E_N$. The concentration of oxygen is $N_1<N_0\leq N_N$.

Thereafter, the titanium film remaining without reacting with silicon is etched by using an etchant containing hydrogen peroxide, ammonium and water at a ration 5:2:2 to leave the titanium silicide layers 413 and 414. After the etching, a silicon oxide 415 of 5000 Å thick is formed on the entire structure through a plasma CVD. Contact holes are opened through the silicon oxide film 415 following which the aluminum electrodes 416 and 417 are formed on the source and drain regions. Thus, the manufacture of a TFT is completed.

In the above structure, the silicide layers 413 and 414 prevent the aluminum electrodes 416 and 417 from directly contacting the silicon of the source and drain regions. Accordingly, a contact having an excellent property can be obtained. It may be possible to carry out a hydrogen annealing at 200°–400° C. to activate the impurity regions.

Figure 6E:
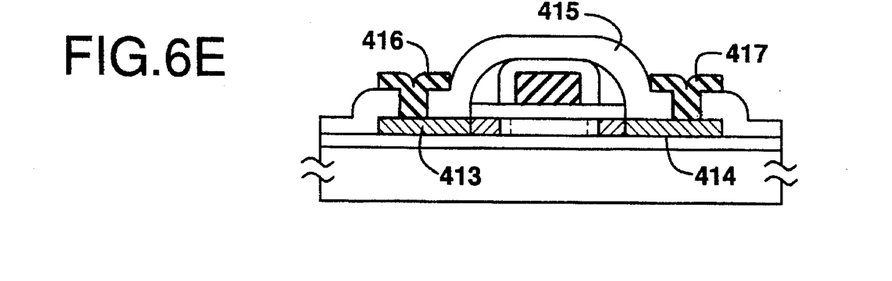

Accordingly, the TFT of this example has a channel region, a pair of oxygen added regions located adjacent the channel region, and a pair of silicide layers as source and drain regions further located adjacent the oxygen added regions. (FIG. 6E).

In this example, since the silicide regions 413 and 414 lower the sheet resistance of the source and drain regions, it is possible to lessen the doping amount of the source and drain regions to 1/10 or less of the doping amount of the third example. For this reason, the electric field at the boundary region between the channel region and the drain region becomes gentle and the leak current can be reduced. Also, the time required for the doping can be reduced to 1/10 or less.

However, it is possible to add the one conductivity type impurity into the portion of a semiconductor layer defined by the insulating materials 410 and 412, thereby forming N+ regions. This may be done instead of forming the metal silicide or in combination therewith.

In the foregoing third and fourth examples, the boundary regions between the channel region and the impurity regions are doped with oxygen, carbon, nitrogen or the like. There was a problem in the prior art that these regions have a large distortion, however, the added impurity reduces it, resulting in reducing the off current.

Also, the active layer may be crystallized not only by a solid phase growth but also through laser annealing or RTA.

Also, the solid phase growth may be combined with laser annealing or RTA.

The foregoing method may be applied not only to NTFTs but also to PTFTs. However, in the case of the first and second examples, since the channel region is added with oxygen, nitrogen, carbon or the like, there is a tendency that a threshold voltage is shifted. For example, when adding oxygen into the channel region, 1–10% of the added oxygen becomes donor and the conductivity becomes a weak N-type. Accordingly, the threshold voltage shifts to a positive side either in the NTFT or PTFT.

Further, the present invention is applicable not only to a formation of a semiconductor circuit comprising a same kind of TFTs on one substrate but also to a formation of a semiconductor integrated circuit comprising different kinds of TFTs on one substrate. For example, a part of a semiconductor integrate circuit includes a self-aligned type TFT having no offset or an offset-gate type TFT of conventional type while the other part of the circuit employs the present invention.

Now, the followings are explanations of the second preferred embodiment of the present invention. In accordance with the second embodiment, when forming a plurality of TFTs having different functions on one substrate, that is, large mobility TFTs and small mobility TFTs, ions of carbon, nitrogen, oxygen, silicon and a mixture thereof are introduced only into the small mobility TFTs while masking the large mobility TFTs. It is preferable that hydrogen ions are also introduced at the same time. The mask may be formed by a conventional method which is used in a conventional CMOS technique, that is, forming a photoresist on a substrate, and patterning. Alternatively, it is possible to use a metal mask which is not adhered to the substrate. In the latter case, the process is simplified and is suitable to a case in which the accuracy of the masking is not so strictly required, for example, an electro-optical device having an active matrix circuit region to be irradiated with the ions and a peripheral circuit region to be masked.

After introducing the ions, active layers of both of the large mobility TFTs and the small mobility TFTs are crystallized through heat annealing. The heat annealing is advantageous in its uniformity. Also, the annealing may be performed after the formation of a gate electrode, or either before or after forming source and drain regions. The heat annealing is limited depending upon the substrate material or other materials. For example, in the case of using silicon or quartz as a substrate, the upper limit of the heat annealing is 1100° C. at maximum. In the case of using other substrate, for example, Corning 7059 glass which is a typical non-alkaline glass, it is preferable that the heat annealing is conducted at a temperature not higher than 650° C.

One example of the second embodiment of the invention is a semiconductor circuit for a liquid crystal device in which PMOS TFTs are used in an active matrix region having their active regions in which oxygen, nitrogen or carbon is contained at a concentration of not lower than $10^{18}$ atoms/$cm^3$, preferably not lower than $5 \times 10^{19}$ atoms/$cm^3$ while TFTs in a peripheral circuit region have active layers in which the concentration of oxygen, nitrogen or carbon is not higher than $1 \times 10^{19}$ atoms/$cm^3$, preferably not higher than $1 \times 10^{17}$ atoms/$cm^3$. The use of a PMOS TFT is more advantageous for reducing the leak current than the use of a NMOS TFT. The upper limit of the impurity such as oxygen added to the active layer is $4 \times 10^{21}$ atoms/$cm^3$.

Also, in the present invention, an NMOS TFT may be connected to the PMOS TFT in series in the pixel region. Of course, two PMOS TFTs may be used in parallel in the pixel region.

Further, in a liquid crystal device having a display circuit portion (i.e. active matrix portion) and a driving circuit portion (peripheral circuit portion), it is effective to constitute the driving circuit with CMOS circuits. While it is not necessary to constitute all of the driving circuit with CMOS, it is desirable to constitute transmission-gate and inverter circuits with CMOS.

As to the CMOS circuit in the driver portion, it is desirable that the concentration of impurities such as oxygen, nitrogen, carbon or the like in the active layer is maintained not higher than $1 \times 10^{19}$ atoms/$cm^3$, preferably, not higher than $1 \times 10^{17}$ atoms/$cm^3$. As a result, the threshold voltage of the TFT is 0.5–2 V in the case of NMOS, –0.5—3 V in the case of PMOS, further the mobility is 30–150 $cm^2$/Vs in the case of NMOS, 20–100 $cm^2$/Vs in the case of PMOS.

On the other hand, in the active matrix portion, it is possible to reduce an auxiliary capacitance or completely omit it by using a single element (TFT) or a plurality of elements connected in series of which leak current is as small as 1 pA with the drain voltage 1 V.

Also, another feature of the present invention is that a CPU circuit or a memory circuit is formed on the same substrate together with TFTs used at pixels and for a peripheral driver circuit.

For example, the operation speed of a single crystalline IC has reached a point after which it is not possible to further increase the speed. It would necessary to increase a current capacity of a transistor if one intends to further increase the operation speed. However, this leads to the increase in power consumption.

One reason that the operation speed of a single crystalline IC can not be increased is because a capacitance is induced between the substrate and wirings by which a loss is caused. If an insulating material is used as a substrate, the operation speed can be sufficiently increased without increasing the consumed current. For this reason, an IC having an SOI structure (i.e. semiconductor on insulator) has been proposed.

Accordingly, the formation of a CPU circuit or memory circuit using TFTs on the same substrate as TFTs constituting a matrix circuit and TFTs constituting a peripheral circuit such as a driver circuit and decoder circuit is especially advantageous for down-sizing or integrating the liquid crystal display device.

In the present invention, the doping of oxygen, nitrogen or carbon into the active layer reduces a leak current, however, the mobility in the active layer is also reduced by the doping. Accordingly, the doping amount should be selected in order to optimize the leak current and the mobility depending upon the desired characteristics.

Figure 7:
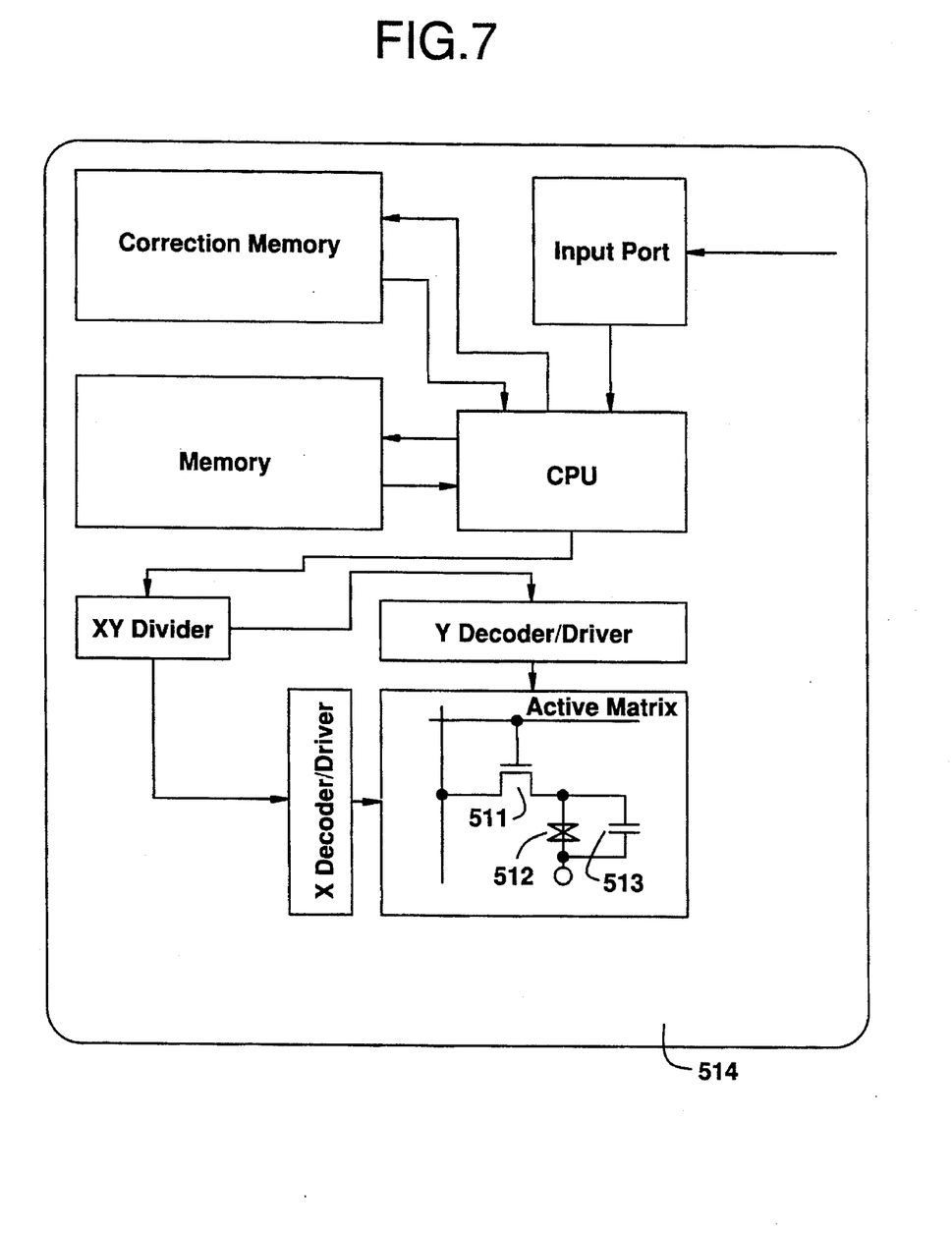
FIG. 7 is a block diagram showing a thin film semiconductor integrated circuit in accordance with the second preferred embodiment of the invention.

FIG. 7 shows an integrated circuit formed on a substrate for a liquid crystal device. Reference numeral 511 shows one NTFT provided in one pixel in an active matrix portion, 512 shows a liquid crystal, and 513 shows a capacitor. In accordance with the present invention, all the TFTs constituting an input port, a correction memory, a memory, a CPU, an X-Y divider, and an X-decoder/driver, a Y-decoder/driver are formed on the same substrate.

The input port is to read a signal input from outside and converting it into a display signal. The correction memory is to correct the input signal or the like for each pixel depending upon the specific characteristics of the active matrix panel. In particular, the correction memory comprises a non-volatile memory storing specific information of each pixel of the panel. For example, when there is a point defect in one pixel of an electro-optical device, the pixels around the defect are supplied with corrected signals so that the defect appears less. Also, when the brightness in one pixel is lower than others, a stronger signal is sent to the pixel in order to compensate the brightness.

The CPU and the memory have the same functions as those used in a conventional computer. In particular, the memory comprises a RAM having a display memory in correspondence with each pixel. Also, it is possible to control back light which is to irradiate the substrate from the rear side.

Among the foregoing TFTs, the TFT 511 provided at each pixel contains oxygen (or nitrogen, carbon) at a concentration not lower than $5 \times 10^{19}$ atoms/cm$^3$ so that a leak current is reduced. Also, the concentration of oxygen, nitrogen or carbon in the other TFTs constituting the peripheral circuit is $1 \times 10^{19}$ atoms/cm$^3$ or lower so that a large mobility is obtained.

It is obvious in view of the foregoing teaching that a further improvement can be made by forming other electric circuits or integrated circuits using TFTs formed on the same substrate.

[EXAMPLE 5]

This example is directed to the manufacture of a peripheral circuit and an active matrix circuit for a liquid crystal device using polysilicon TFTs through a low temperature annealing process. FIGS. 8A–8D are cross sections showing the manufacturing process of the semiconductor integrated circuit.

Figure 8A:
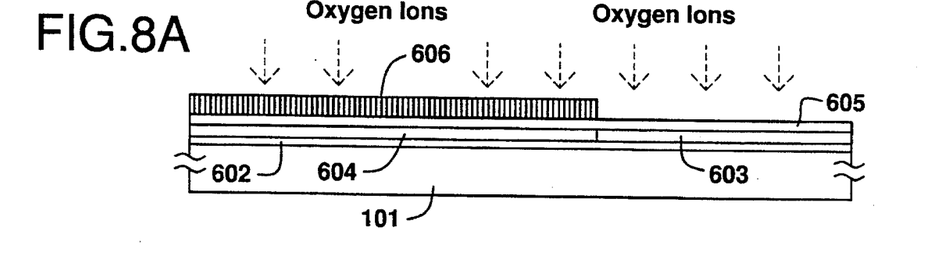
FIGS. 8A–8D are cross sectional views showing a manufacturing method of a thin film semiconductor integrated circuit in accordance with the fifth example of the invention.

Initially, an oxide film 602 is formed as an underlying layer to a thickness of 200–2000 Å by sputtering on a Corning 7059 substrate 601. Further, an amorphous silicon film of 500–1500 Å is formed on the silicon oxide film 602 through a plasma CVD or a low pressure CVD using monosilane or disilane as a starting material. This film includes a peripheral circuit region 604 and an active matrix region (pixel region) 603. The concentration of carbon, oxygen and nitrogen in the amorphous silicon film is not higher than $1 \times 10^{19}$ atoms/cm$^3$, in this example, not higher than $1 \times 10^{17}$ atoms/cm$^3$. The low pressure CVD is suitable for achieving this concentration level. A silicon oxide film 605 of 100–500 Å thick is further formed on the amorphous silicon film by sputtering as a blocking layer. Thereafter, the peripheral circuit region 604 is covered with a mask 606 such as a photoresist so that only the active matrix region 603 is exposed.

Then, as shown in FIG. 8A, oxygen ions are irradiated using an ion doping apparatus. The acceleration voltage is controlled depending upon the thickness of the blocking layer 605, for example, within the range of 10–100 keV. The dose amount should be decided in accordance with the thickness of the blocking layer 605, the acceleration voltage, and the thickness of the amorphous silicon film 603. For example, when the amorphous silicon is 1000 Å thick, the protective film 605 is 250 Å thick and the acceleration voltage is 50 keV, the dose amount should be $5 \times 10^{14}$ atoms/cm$^2$ so that the concentration of the oxygen is $5 \times 10^{19}$ atoms/cm$^3$ throughout the amorphous silicon film 603.

Also, instead of using a photoresist mask, a metal mask 606' may be used as shown in FIG. 8A'. In this case, a photolithography process is not needed. While a photoresist is carbonized due to the ion irradiation and the step for removing it is necessary, such a step is not necessary in the case of using a metal mask. In the meantime, the concentration of oxygen distributes more moderately in the case of using a metal mask than in the case of using a photoresist.

Figure 8B:
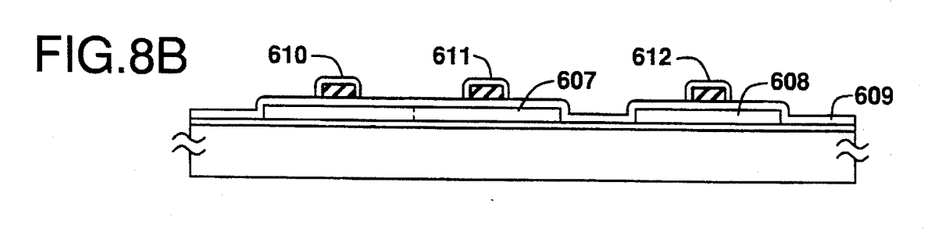
Figure 8C:
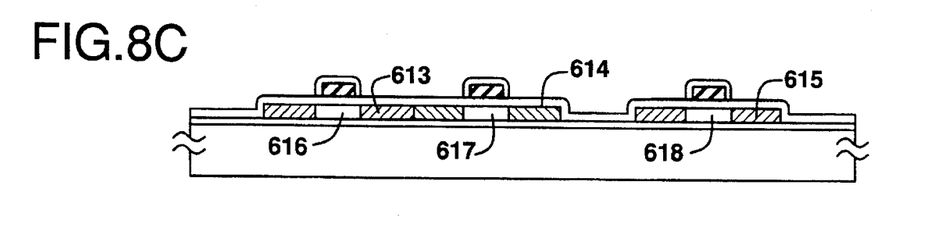

Then, after removing the photoresist 606, the amorphous silicon film is crystallized by heating at 600° C. for 24 hours. Subsequently, the silicon film is patterned into a silicon island 607 for a peripheral circuit and another silicon island 608 for an active-matrix circuit as shown in FIG. 8B. Further, a silicon oxide film of 500–1500 Å thick is formed on these silicon islands to form a gate insulator 609. An aluminum film of 2000 Å to 5 μm is further formed on the silicon oxide film by an electron beam evaporation and then patterned into a gate electrode on each island.

Further, the substrate is dipped in an electrolyte and the gate electrodes are electrified to form an anodic oxide film (610, 611 and 612) around the gate electrodes. The anodic oxide film in the peripheral circuit region should be relatively thin in order to improve the mobility. The anodic oxide film in the active matrix region should be relatively thick so that the leak current can be reduced. In any event, the thickness of the anodic oxide film ranges from 1000 to 2500 Å.

Then, the silicon film is selectively doped with impurities in a self-aligning manner with respect to the gate portion including the gate electrode and the anodic oxide. At this time, phosphorous is initially added into the entire region using phosphine (PH$_3$) as a dopant gas, following which the left side of the silicon island 607 and the silicon island 608 to become PTFTs are doped with boron using diborane (B$_2$H$_6$) as a dopant gas while masking the right side of the silicon island 607 (to be an NTFT) with a photoresist. The dose amount of phosphorous is $2-8 \times 10^{15}$ atoms/cm$^2$ while the dose amount of boron is $0.4-1 \times 10^{16}$ atoms/cm$^2$. The dose amount of boron should be higher than that of phosphorous.

The crystallinity of the silicon film is damaged due to the doping process and the sheet resistance is as large as 1 kΩ/square. If this value is too large, it is possible to reduce the sheet resistance by annealing at 600° C. for 2 to 24 hours. The annealing may be carried out through RTA with IR light. The RTA makes use of a characteristics that IR light is selectively absorbed by silicon and impurities contained in the silicon. Also, the IR light is unlikely absorbed by a glass substrate. Accordingly, the RTA is comparable in effect with the high temperature annealing at 1000° C.

By the foregoing steps, an N-type region 614, and P-type regions 613 and 615 are formed. The sheet resistance in these regions is 200–800 Ω/square. Also, channel regions 616, 617 and 618 are defined at the same time. Each concentration of the nitrogen, oxygen and carbon in the channel regions 616 and 617 is not higher than $1 \times 10^{17}$ atoms/cm$^3$ while the concentration of oxygen in the channel region 618 is $5 \times 10^{19}$ atoms/cm$^3$ because of the step shown in FIGS. 8A or 8A'. On the entire structure, an interlayer insulator 619 comprising silicon oxide is formed through sputtering to a thickness of 3000–10000 Å. Instead of sputtering, a plasma CVD may be employed to form the silicon oxide using a TEOS as a starting material. The TEOS plasma CVD is particularly advantageous because of its good step coverage.

Figure 8D:
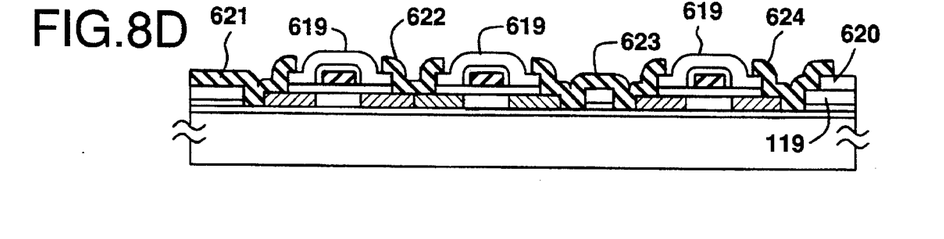

Referring to FIG. 8D, an ITO film is deposited by sputtering and then patterned to form a pixel electrode 620. Subsequently, contact holes are opened through the interlayer insulator 619 corresponding the source and drain regions, following which chromium wirings 621 to 624 are formed. In FIG. 8D, a CMOS TFT is formed in the silicon island 607. Also, the wirings 621–624 may be constituted by a multilayer of a chromium or titanium nitride as a lower layer and an aluminum film formed thereon. Thereby, the sheet resistance can be reduced. Finally, the entire structure is exposed to hydrogen at 350° C. for 2 hours to decrease the dangling bonds in the silicon. Accordingly, peripheral driver circuit and an active matrix circuit can be united.

As said before, a memory circuit and a CPU circuit may be formed on the same substrate at the same time as the formation of the peripheral circuit and the active matrix circuit.

Furthermore, the TFT in accordance with Examples 1 through 4 can be applied to the TFT formed in the active matrix region while the peripheral circuit are formed with higher mobility TFTs.

While various examples have been disclosed, the scope of the invention should not be limited to those specific examples but many modifications may be made. For example, instead of aluminum, it is possible to use other metals such tantalum or titanium or phosphorous doped silicon as a material for the gate electrode. Also, although a liquid crystal display device is discussed in the embodiments, the present invention is applicable to an image sensor by forming solid image sensing elements and a driving circuit on a same substrate. In this case, a required memory circuit or CPU circuit may be formed on the same substrate by TFTs.

What is claimed is:

1. A semiconductor device comprising:
   a substrate having an insulating surface;
   a semiconductor layer formed on said insulating surface, said semiconductor layer comprising a first region, at least one second region and a pair of third regions, said first region functioning as a channel and said pair of third regions functioning as source and drain regions;
   a gate insulating layer located adjacent to said semiconductor layer; and
   a gate electrode located adjacent to said gate insulating layer,
   wherein said first and second regions extend between said pair of third regions and said at least one second region extends between said first region and at least one of said third regions, and
   wherein a total concentration of oxygen, carbon and nitrogen in said at least one second region is higher than a total concentration of oxygen, carbon and nitrogen in said first region.

2. The semiconductor device of claim 1 wherein said semiconductor layer is crystalline.

3. The semiconductor device of claim 1 wherein the total concentration of oxygen, carbon and nitrogen in said at least one second region is the same as a total concentration of oxygen, carbon and nitrogen in said pair of third regions.

4. The semiconductor device of claim 1 wherein said gate electrode is provided with an anodic oxide thereof on its surface.

5. The semiconductor device of claim 1 wherein said semiconductor layer comprises silicon.

6. The semiconductor device of claim 5 wherein said source and drain regions comprise a metal silicide.

7. The semiconductor device of claim 6 wherein said metal silicide contains a metal selected from the group consisting of titanium, tungsten, platinum, palladium and nickel.

8. The semiconductor device of claim 1 wherein said semiconductor layer contains a crystallization promoting metal element.

9. The semiconductor device of claim 4 wherein each boundary between said at least one second region and said pair of third regions is aligned with an outer edge of said anodic oxide.

10. The semiconductor device of claim 1 wherein said pair of third regions is doped with one conductivity type impurity at a first concentration.

11. The semiconductor device of claim 10 wherein said at least one second region is doped with said one conductivity type impurity at a second concentration which is smaller than said first concentration.

12. A semiconductor device comprising:
    a substrate having an insulating surface;
    a semiconductor layer formed on said insulating surface, said semiconductor layer comprising a first region, a pair of second regions between which said first region extends, and a pair of third regions between which said first and second regions extend;
    a gate insulating layer located adjacent to the first region of said semiconductor layer;
    a pair of metal silicide layers contacting said pair of third regions; and
    a gate electrode located adjacent to said gate insulating layer,
    wherein said first region and said pair of second regions have an intrinsic or substantially intrinsic conductivity type, said pair of third regions are doped with one conductivity type impurity and have one conductivity type, a concentration of carbon, oxygen or nitrogen contained in said pairs of second and third regions is higher than that in said first region.

13. The semiconductor device of claim 12 wherein said semiconductor layer is crystalline.

14. The semiconductor device of claim 12 wherein said metal silicide layers are doped with carbon, nitrogen or oxygen at the same concentration as said pair of third regions.

15. The semiconductor device of claim 12 wherein said gate electrode is provided with an anodic oxide thereof on its surface.

16. The semiconductor device of claim 12 wherein said semiconductor layer comprises silicon.

17. The semiconductor device of claim 12 wherein said pair of metal silicide layers are doped with said one conductivity type impurity at a concentration higher than that contained in said pair of third regions.

18. The semiconductor device of claim 12 wherein said pair of metal silicide layers contain a metal selected from the group consisting of titanium, tungsten, platinum, palladium and nickel.

19. The semiconductor device of claim 12 wherein said semiconductor layer contains a crystallization promoting metal element.

20. The semiconductor device of claim 15 wherein each boundary between said pair of second regions and said pair of third regions is aligned with an outer edge of said anodic oxide.

21. A thin film semiconductor integrated circuit comprising:
    a substrate having an insulating surface, said substrate having an active matrix circuit portion and a peripheral circuit portion;
    a plurality of electrodes formed in the active matrix circuit portion;

a plurality of first thin film transistors connected to said electrodes in the active matrix circuit portion;

a plurality of second thin film transistors formed in said peripheral circuit portion, said second thin film transistors constituting at least an X-decoder/driver, a Y-decoder/driver, a memory circuit and a CPU circuit, wherein a concentration of carbon, nitrogen or oxygen contained in an active semiconductor layer of said first thin film transistors is higher than a concentration of carbon, nitrogen or oxygen contained in an active semiconductor layer of said second thin film transistors.

22. The integrated circuit of claim 21 wherein the concentration of carbon, nitrogen or oxygen in the active semiconductor layer of said first thin film transistor is not lower than $5\times10^{19}$ atoms/cm$^3$.

23. The integrated circuit of claim 22 wherein the concentration of carbon, nitrogen or oxygen in the active semiconductor layer of said second thin film transistor is not higher than $1 \times 10^{19}$ atoms/cm$^3$.

24. The integrated circuit of claim 21 further comprising a correction memory formed in said peripheral circuit portion and connected to said CPU circuit, wherein said correction memory is constituted by TFTs formed on said substrate.

25. The integrated circuit of claim 21 wherein each of said first thin film transistors is provided with a metal silicide layer within or in contact with source and drain regions thereof.

26. A semiconductor device comprising:

a substrate having an insulating surface;

a semiconductor layer formed on said insulating surface, said semiconductor layer comprising a first region, at least one second region and a pair of third regions, said first region functioning as a channel and said pair of third regions functioning as source and drain regions;

a gate insulating layer located adjacent to said semiconductor layer; and a gate electrode located adjacent to said gate insulating layer, wherein said first and second regions extend between said pair of third regions and said at least one second region extends between said first region and at least one of said third regions, and wherein a total concentration of oxygen, carbon and nitrogen in said pair of third regions is higher than a total concentration of oxygen, carbon and nitrogen in said at least one second region.

27. A semiconductor device comprising:

a substrate having an insulating surface;

a semiconductor layer formed on said insulating surface, said semiconductor layer comprising a first region, at least one second region and a pair of third regions, said first region functioning as a channel and said pair of third regions functioning as source and drain regions;

a gate insulating layer located adjacent to said semiconductor layer; and a gate electrode located adjacent to said gate insulating layer, wherein said first and second regions extend between said pair of third regions and said at least one second region extends between said first region and at least one of said third regions, wherein a total concentration of oxygen, carbon and nitrogen in said at least one second region is higher than a total concentration of oxygen, carbon and nitrogen in said first region, and wherein a total concentration of oxygen, carbon and nitrogen in said pair of third regions is higher than a total concentration of oxygen, carbon and nitrogen in said second at least one region.

28. A semiconductor device comprising:

a substrate having an insulating surface;

a semiconductor layer formed on said insulating surface, said semiconductor layer comprising a first region, at least one second region and a pair of third regions, said first region functioning as a channel and said pair of third regions functioning as source and drain regions;

a gate insulating layer located adjacent to said semiconductor layer; and a gate electrode located adjacent to said gate insulating layer, wherein said first and second regions extend between said pair of third regions and said at least one second region extends between said first region and at least one of said third regions, and wherein a band gap of said at least one second region is higher than a band gap of said first region.

29. A semiconductor device comprising:

a substrate having an insulating surface;

a semiconductor layer formed on said insulating surface, said semiconductor layer comprising a first region, at least one second region and a pair of third regions, said first region functioning as a channel and said pair of third regions functioning as source and drain regions;

a gate insulating layer located adjacent to said semiconductor layer; and a gate electrode located adjacent to said gate insulating layer, wherein said first and second regions extend between said pair of third regions and said at least one second region extends between said first region and at least one of said third regions, and wherein band gaps of said pair of third regions are higher than a band gap of said at least one second region.

30. A semiconductor device comprising:

a substrate having an insulating surface;

a semiconductor layer formed on said insulating surface, said semiconductor layer comprising a first region, at least one second region and a pair of third regions, said first region functioning as a channel and said pair of third regions functioning as source and drain regions;

a gate insulating layer located adjacent to said semiconductor layer; and a gate electrode located adjacent to said gate insulating layer, wherein said first and second regions extend between said pair of third regions and said at least one second region extends between said first region and at least one of said third regions, wherein a band gap of said at least one second region is higher than a band gap of said first region, and wherein band gaps of said pair of third regions are higher than a band gap of said at least one second region.

* * * * *